(12) United States Patent
Inokuchi et al.

(10) Patent No.: US 10,896,708 B2
(45) Date of Patent: Jan. 19, 2021

(54) MAGNETIC MEMORY DEVICE

(71) Applicant: KABUSHIKI KAISHA TOSHIBA, Tokyo (JP)

(72) Inventors: Tomoaki Inokuchi, Yokohama Kanagawa (JP); Katsuhiko Koui, Yokohama Kanagawa (JP); Naoharu Shimomura, Meguro Tokyo (JP); Hideyuki Sugiyama, Kawasaki Kanagawa (JP); Kazutaka Ikegami, Inagi Tokyo (JP); Susumu Takeda, Kawasaki Kanagawa (JP); Satoshi Takaya, Kawasaki Kanagawa (JP); Shinobu Fujita, Koto Tokyo (JP); Hiroaki Yoda, Kawasaki Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 16/741,246

(22) Filed: Jan. 13, 2020

(65) Prior Publication Data
US 2020/0279596 A1    Sep. 3, 2020

(30) Foreign Application Priority Data

Feb. 28, 2019   (JP) .................................. 2019-036214

(51) Int. Cl.
*G11C 11/00*      (2006.01)
*G11C 11/16*      (2006.01)
(Continued)

(52) U.S. Cl.
CPC ........ *G11C 11/161* (2013.01); *G11C 11/1659* (2013.01); *G11C 11/1673* (2013.01);
(Continued)

(58) Field of Classification Search
CPC ............. G11C 11/161; G11C 11/1675; G11C 11/1673; G11C 11/5607; G11C 11/16;
(Continued)

(56) References Cited

U.S. PATENT DOCUMENTS 9,449,668 B2 *    9/2016   Kent ................... G11C 11/1659
2014/0056060 A1   2/2014   Khvalkovskiy et al.
(Continued)

FOREIGN PATENT DOCUMENTS

JP        2014-45196 A      3/2014
JP        2017-112351 A     6/2017

*Primary Examiner* — Thong Q Le
(74) *Attorney, Agent, or Firm* — Finnegan, Henderson, Farabow, Garrett & Dunner, L.L.P.

(57) ABSTRACT

According to one embodiment, a magnetic memory device includes a conductive member, a first element portion, and a controller. The conductive member includes a first portion, a second portion, and a third portion between the first portion and the second portion. The first element portion includes a first element, a first interconnect, and a first circuit. The first element includes a first magnetic layer, a first counter magnetic layer, and a first nonmagnetic layer. The first counter magnetic layer is provided between the third portion and the first magnetic layer. The first nonmagnetic layer is provided between the first counter magnetic layer and the first magnetic layer. The first interconnect is electrically connected to the first magnetic layer. The first circuit is electrically connected to the first interconnect. The first circuit includes a first switch, a first capacitance element, a first parallel switch, and a first parallel capacitance element.

15 Claims, 6 Drawing Sheets

(51) Int. Cl.
  *H01L 43/02* (2006.01)
  *H01L 27/22* (2006.01)
  *H01L 43/10* (2006.01)

(52) U.S. Cl.
  CPC ............ *H01L 27/228* (2013.01); *H01L 43/02* (2013.01); *H01L 43/10* (2013.01)

(58) Field of Classification Search
  CPC ............ G11C 11/1659; G11C 11/1653; G11C 11/1697; G11C 11/18; G11C 11/15; H01L 43/08; H01L 27/222; H01L 27/228; H01L 43/02; H01L 43/10; H01L 29/66984; H01L 29/82; H01L 43/12
  USPC ... 365/158, 171, 173, 170, 66, 97, 131, 145, 365/157, 225.7; 257/E27.005, E43.004, 257/421, E29.323
  See application file for complete search history.

(56) References Cited

U.S. PATENT DOCUMENTS

| | | |
|---|---|---|
| 2014/0056061 A1 | 2/2014 | Khvalkovskiy et al. |
| 2017/0169872 A1 | 6/2017 | Yoda et al. |

* cited by examiner

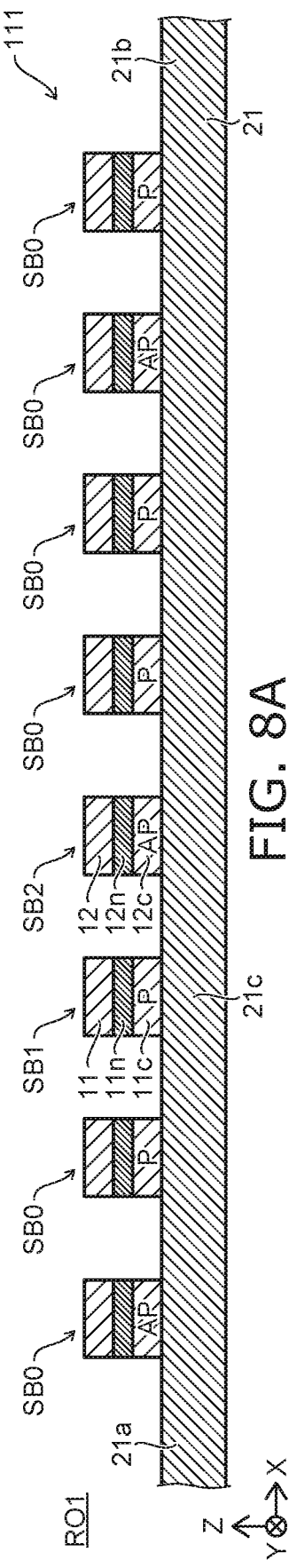
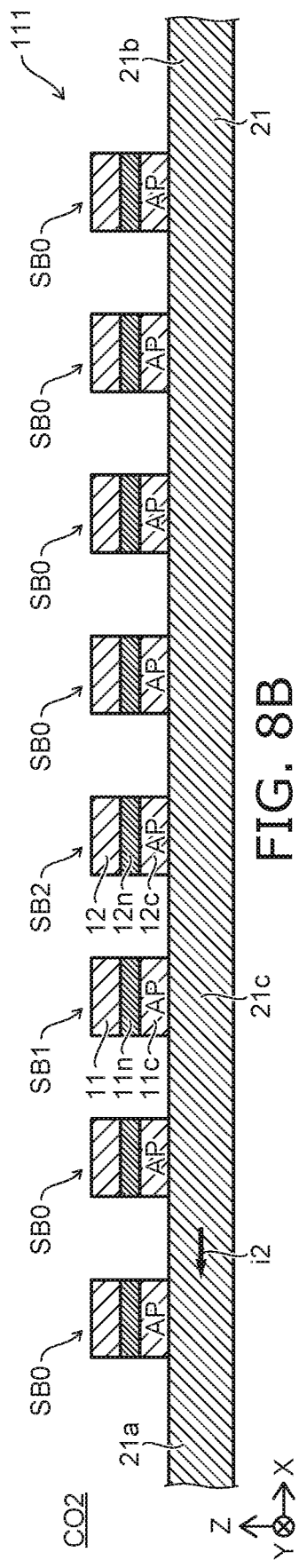
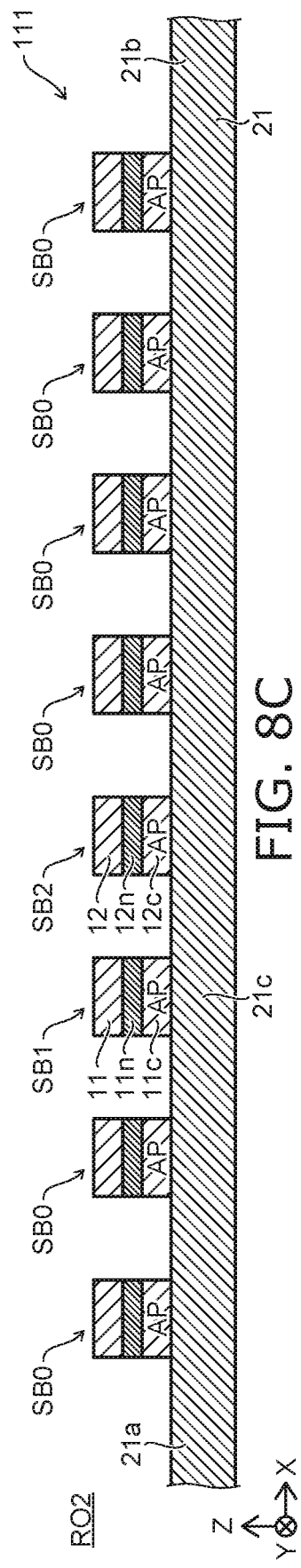

MAGNETIC MEMORY DEVICE

CROSS-REFERENCE TO RELATED APPLICATIONS

This application is based upon and claims the benefit of priority from Japanese Patent Application No. 2019-036214, filed on Feb. 28, 2019; the entire contents of which are incorporated herein by reference.

FIELD

Embodiments described herein relate generally to a magnetic memory device.

BACKGROUND

Stable operations of a magnetic memory device are desirable.

BRIEF DESCRIPTION OF THE DRAWINGS

FIG. 8A to FIG. 8C are schematic views illustrating operations of the magnetic memory device according to the second embodiment.

DETAILED DESCRIPTION

Figure 1:
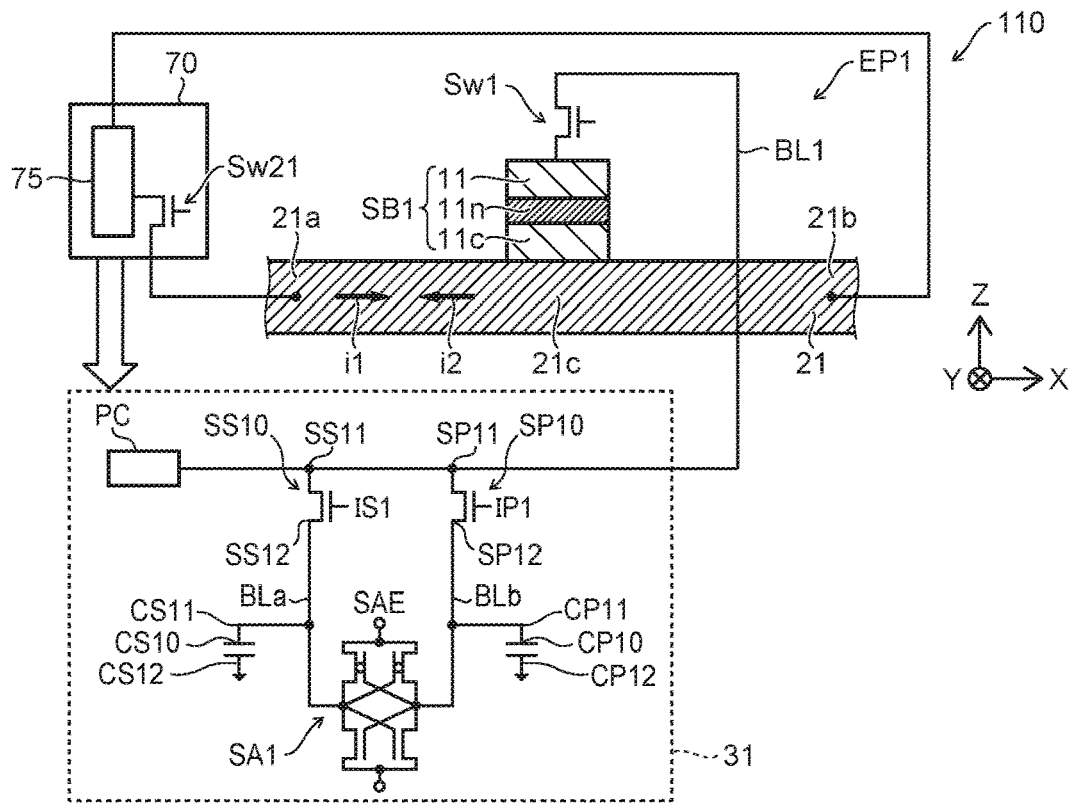
FIG. 1 is a schematic view illustrating a magnetic memory device according to a first embodiment.

According to one embodiment, a magnetic memory device includes a conductive member, a first element portion, and a controller. The conductive member includes a first portion, a second portion, and a third portion between the first portion and the second portion. The first element portion includes a first element, a first interconnect, and a first circuit. The first element includes a first magnetic layer, a first counter magnetic layer, and a first nonmagnetic layer. The first counter magnetic layer is provided between the third portion and the first magnetic layer. The first nonmagnetic layer is provided between the first counter magnetic layer and the first magnetic layer. The first interconnect is electrically connected to the first magnetic layer. The first circuit is electrically connected to the first interconnect. The first circuit includes a first switch, a first capacitance element, a first parallel switch, and a first parallel capacitance element. One end of the first switch is electrically connected to the first interconnect. An other end of the first switch is electrically connected to one end of the first capacitance element. One end of the first parallel switch is electrically connected to the first interconnect. An other end of the first parallel switch is electrically connected to one end of the first parallel capacitance element. The controller performs at least a first current supply operation. In the first current supply operation, the controller sets the first switch to a conducting state and supplies a first current to the conductive member from the first portion toward the second portion.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

FIG. 1 is a schematic view illustrating a magnetic memory device according to a first embodiment.

As shown in FIG. 1, the magnetic memory device 110 according to the embodiment includes a conductive member 21, a first element portion EP1, and a controller 70.

The conductive member 21 includes a first portion 21a, a second portion 21b, and a third portion 21c. The third portion 21c is between the first portion 21a and the second portion 21b.

The first element portion EP1 includes a first element SB1, a first interconnect BL1, and a first circuit 31.

The first element SB1 includes a first magnetic layer 11, a first counter magnetic layer 11c, and a first nonmagnetic layer 11n. The first counter magnetic layer 11c is provided between the third portion 21c and the first magnetic layer 11. The first nonmagnetic layer 11n is provided between the first counter magnetic layer 11c and the first magnetic layer 11.

For example, the direction from the first portion 21a toward the second portion 21b is taken as an X-axis direction. One direction perpendicular to the X-axis direction is taken as a Z-axis direction. A direction perpendicular to the X-axis direction and the Z-axis direction is taken as a Y-axis direction.

For example, the direction from the third portion 21c toward the first magnetic layer 11 is aligned with the Z-axis direction.

The first interconnect BL1 is electrically connected to the first magnetic layer 11. The first interconnect BL1 is, for example, a bit line. In the example, a switch Sw1 (e.g., a transistor or the like) is provided in a current path including the first interconnect BL1 and the first magnetic layer 11.

The first circuit 31 is electrically connected to the first interconnect BL1. For example, at least a portion of the first circuit 31 functions as a read circuit.

For example, the controller 70 is electrically connected to the first portion 21a, the second portion 21b, and the first circuit 31. For example, the controller 70 includes a drive circuit 75. A switch (e.g., a transistor or the like), etc., may be provided in a current path between the drive circuit 75 and the conductive member 21. In the example, a switch Sw21 is provided in the current path between the first portion 21a and the drive circuit 75. The switch Sw21 may be provided in a current path between the second portion 21b and the drive circuit 75.

The controller 70 is configured to supply a current to the conductive member 21. For example, in one operation, the controller 70 supplies, to the conductive member 21, a first current i1 having an orientation from the first portion 21a toward the second portion 21b. For example, in another operation, the controller 70 supplies, to the conductive member 21, a second current i2 having an orientation from the second portion 21b toward the first portion 21a.

The electrical resistance of the first element SB1 can be controlled by the orientation of the current flowing in the conductive member 21. For example, when the first current i1 is supplied, the electrical resistance of the first element SB1 is set to a first electrical resistance. For example, when the second current i2 is supplied, the electrical resistance of the first element SB1 is set to a second electrical resistance. The second electrical resistance is different from the first electrical resistance. It is considered that the electrical resistance difference is generated by a spin Hall effect due to the current flowing in the conductive member 21.

For example, the magnetization of the first counter magnetic layer 11c is oriented in one direction due to the first current i1. The magnetization of the first counter magnetic layer 11c is oriented in another direction due to the second current i2. On the other hand, the magnetization of the first magnetic layer 11 substantially does not change. The angle between the magnetization of the first counter magnetic layer 11c and the magnetization of the first magnetic layer 11 when the first current i1 is supplied is different from the angle between the magnetization of the first counter magnetic layer 11c and the magnetization of the first magnetic layer 11 when the second current i2 is supplied. The angle difference becomes the electrical resistance difference. For example, this is based on a magnetoresistance effect.

The multiple electrical resistances are associated with the information to be stored. For example, a high resistance state corresponds to "0." For example, a low resistance state corresponds to "1." The first element SB1 is configured to retain such multiple electrical resistance states. The first element SB1 corresponds to one memory cell.

In the description hereinbelow, the first element SB1 is set to the low resistance state when the first current i1 recited above flows in the conductive member 21; and the first element SB1 is set to the high resistance state when the second current i2 recited above flows in the conductive member 21. The low resistance state and the high resistance state may be interchanged.

When these currents flow, the ease of the change of the magnetization of the first counter magnetic layer 11c changes due to the potential of the first magnetic layer 11 when referenced to the potential of the conductive member 21. For example, the magnetization of the first counter magnetic layer 11c changes easily when a potential Va1 of the first magnetic layer 11 when referenced to the potential of the conductive member 21 has a first polarity which is one of positive or negative. The magnetization of the first counter magnetic layer 11c does not change easily when the potential Va1 of the first magnetic layer 11 has a second polarity which is the other of positive or negative. For example, the magnetization of the first counter magnetic layer 11c when the potential Va1 is a first applied potential having a negative polarity changes easily compared to the magnetization of the first counter magnetic layer 11c when the potential Va1 is a second applied potential having a positive polarity. The first applied potential is, for example, a "select potential." The second applied potential is, for example, an "unselect potential." For example, such a change of the ease of the change of the magnetization is based on the magnetic properties of the first counter magnetic layer 11c changing due to the potential. In the description hereinbelow, the "select potential" is taken to have the negative polarity; and the "unselect potential" is taken to have the positive polarity. These polarities may be reversed in the embodiments.

Information is written to the first element SB1 by operations such as those recited above. For example, the operations recited above are performed by the controller 70.

The first circuit 31 has a function of detecting the information (the electrical resistance state) stored in the first element SB1. For example, the first circuit 31 has a function of a read circuit.

As shown in FIG. 1, the first circuit 31 includes a first switch SS10, a first capacitance element CS10, a first parallel switch SP10, and a first parallel capacitance element CP10.

One end SS11 of the first switch SS10 is electrically connected to the first interconnect BL1. Another end SS12 of the first switch SS10 is electrically connected to one end CS11 of the first capacitance element CS10. For example, the one end CS11 of the first capacitance element CS10 is electrically connected to the other end SS12 of the first switch SS10 by a first circuit interconnect BLa.

One end SP11 of the first parallel switch SP10 is electrically connected to the first interconnect BL1. Another end SP12 of the first parallel switch SP10 is electrically connected to one end CP11 of the first parallel capacitance element CP10. For example, the one end CP11 of the first parallel capacitance element CP10 is electrically connected to the other end SP12 of the first parallel switch SP10 by a second circuit interconnect BLb.

Another end CP12 of the first parallel capacitance element CP10 is electrically connected to another end CS12 of the first capacitance element CS10. In the example, the other end CP12 is electrically connected to the other end CS12 via ground.

For example, a first switch signal IS1 is input to the gate of the first switch SS10. A first parallel switch signal IP1 is input to the gate of the first parallel switch SP10.

In the example, the first circuit 31 includes a first detection circuit SA1. The first detection circuit SA1 is electrically connected to the one end CS11 of the first capacitance element CS10 and the one end CP11 of the first parallel capacitance element CP10.

In the example, the first detection circuit SA1 has a latching sense-amplifier configuration. The first detection circuit SA1 includes a set of a first p-type transistor and a first n-type transistor connected in series, and a set of a second p-type transistor and a second n-type transistor connected in series. These sets are connected in parallel. The gate of the first p-type transistor and the gate of the second n-type transistor are electrically connected to one of the first circuit interconnect BLa or the second circuit interconnect BLb. The gate of the first n-type transistor and the gate of the second p-type transistor are electrically connected to the other of the first circuit interconnect BLa or the second circuit interconnect BLb.

A current that flows in a current path including the first element SB1 is detectable by the first detection circuit SA1. The first detection circuit SA1 outputs the potential of the first circuit interconnect BLa or the second circuit interconnect BLb.

In the example, a pre-charge circuit PC is electrically connected to the first interconnect BL1. The potential of the first interconnect BL1 can be controlled by the pre-charge circuit PC supplying a charge to the first interconnect BL1.

An example of operations of the first circuit 31 will now be described. For example, the first circuit 31 performs a read operation. In one example, the first circuit 31 may further perform a restore operation. The restore operation is performed after the read operation. In the restore operation, the memory state that is changed by the read operation is returned to the state before the read operation.

The restore operation includes a first current supply operation described below. The memory state that is changed by the read operation is set to the state before the read operation by the first current supply operation.

The read operation includes, for example, a first detection operation, a second current supply operation, and a second detection operation described below.

An example of these operations will now be described.

FIG. 2 to FIG. 5 are schematic views illustrating operations of the magnetic memory device according to the first embodiment.

Figure 2:
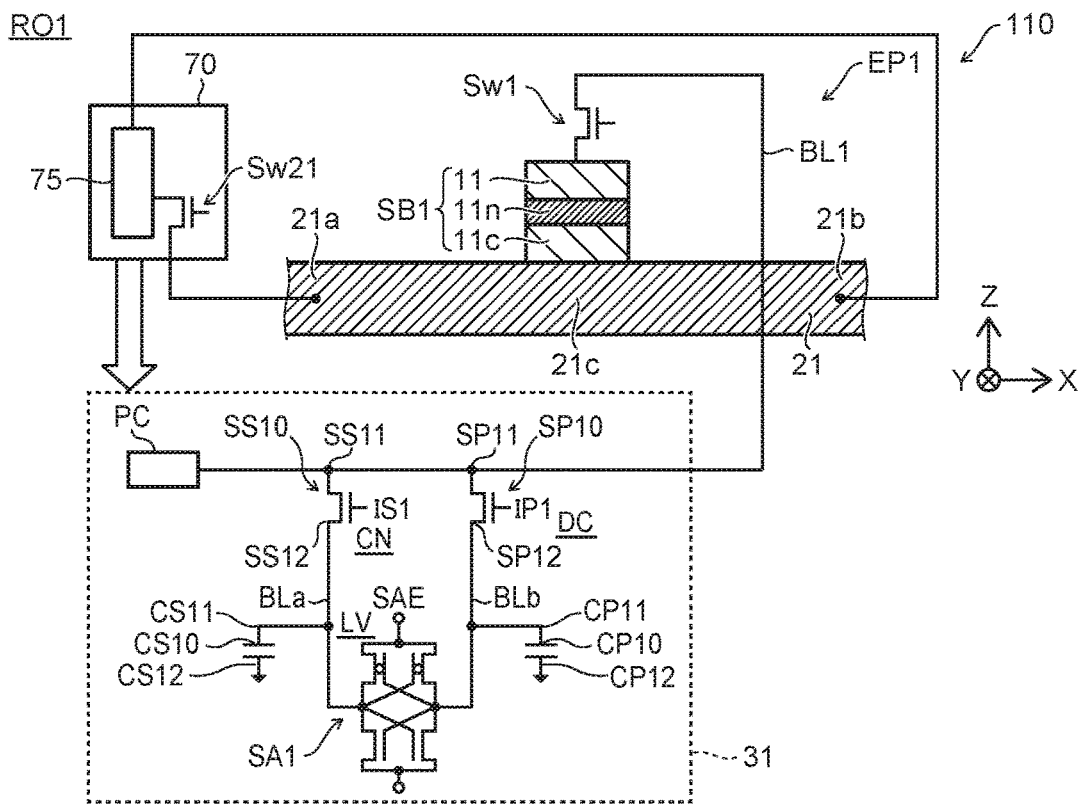
FIG. 2 is a schematic view illustrating the operation of the magnetic memory device according to the first embodiment.
Figure 3:
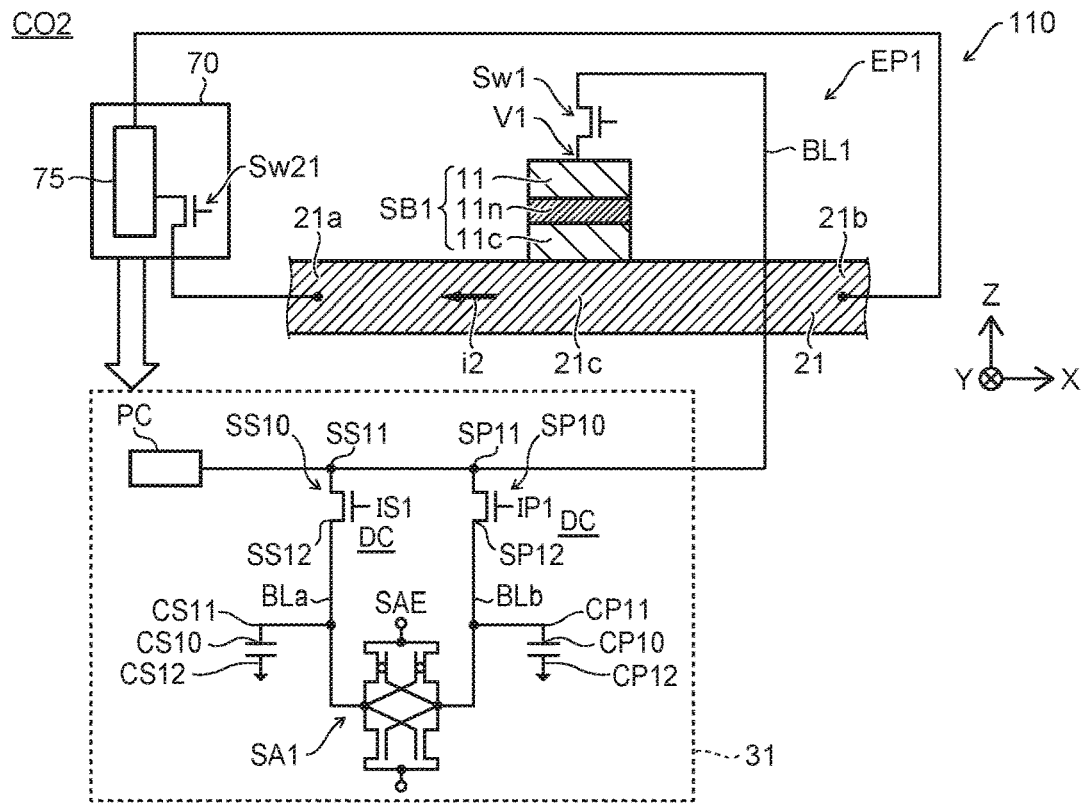
FIG. 3 is a schematic view illustrating the operation of the magnetic memory device according to the first embodiment.
Figure 4:
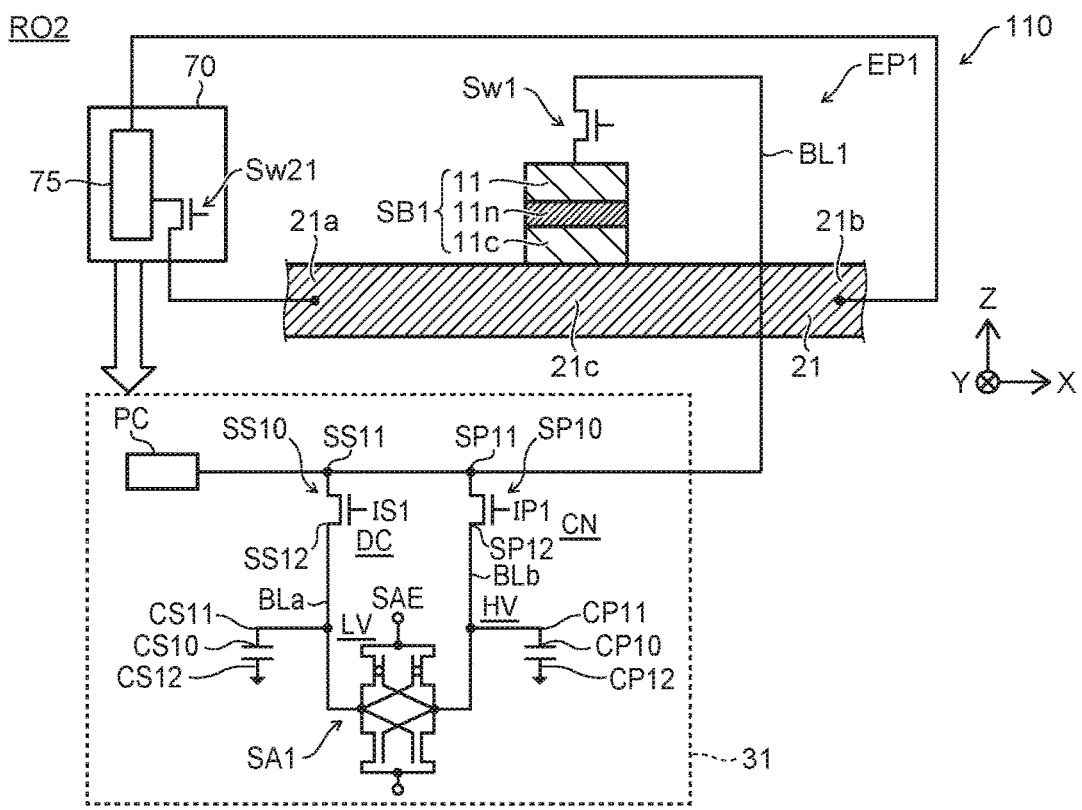
FIG. 4 is a schematic view illustrating the operation of the magnetic memory device according to the first embodiment.
Figure 5:
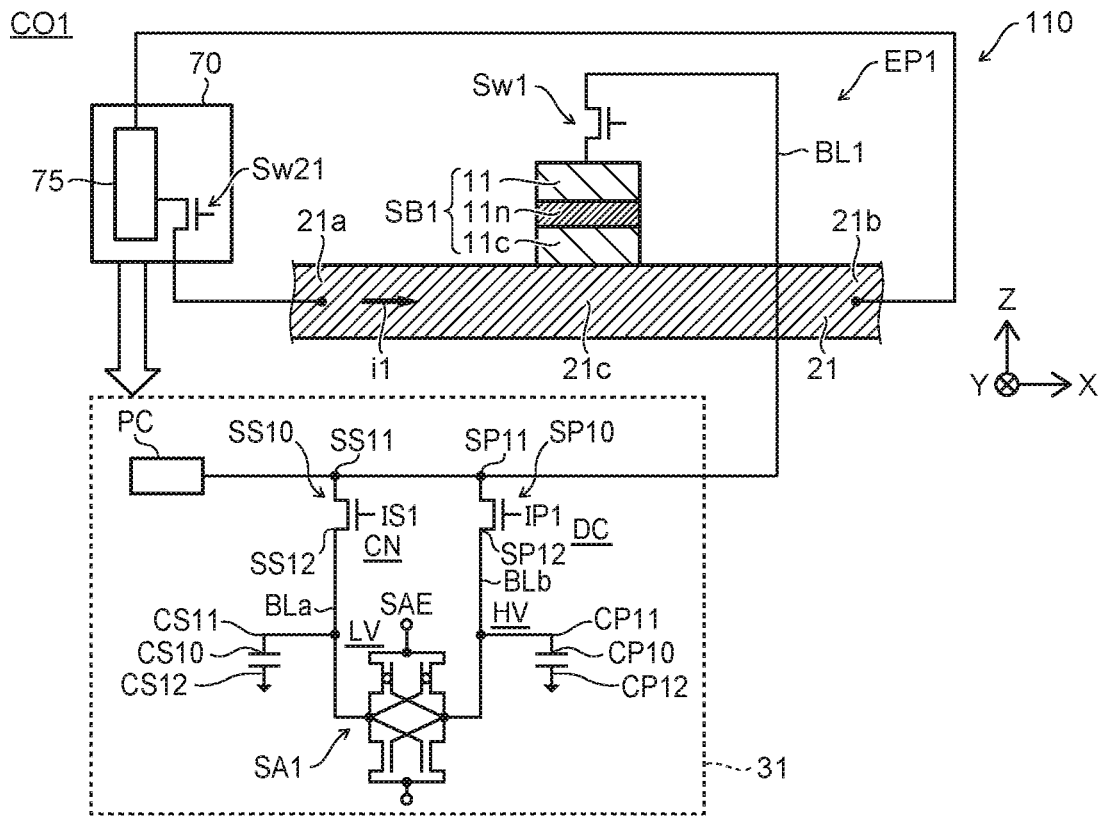
FIG. 5 is a schematic view illustrating the operation of the magnetic memory device according to the first embodiment.

FIG. 2 illustrates the first detection operation RO1. FIG. 3 illustrates the second current supply operation CO2. FIG. 4 illustrates the second detection operation RO2. FIG. 5 illustrates the first current supply operation CO1. In the following description, the switch Sw1 is in a conducting state. In the description hereinbelow first, the first element SB1 is in the low resistance state before the read operation.

In the first detection operation RO1 as shown in FIG. 2, the controller 70 sets the first switch SS10 to a conducting state CN and sets the first parallel switch SP10 to a nonconducting state DC.

Thereby, for example, the potential of the one end CS11 (the first circuit interconnect BLa) of the first capacitance element CS10 changes to a potential corresponding to the electrical resistance of the first element SB1 at this time. When the first element SB1 is in, for example, a low electrical resistance state (e.g., a state in which the magnetization is in a "parallel state P"), the first circuit interconnect BLa has a low voltage LV (e.g., 0.1 V).

In the second current supply operation CO2 as shown in FIG. 3, the controller 70 supplies the second current i2 to the conductive member 21 from the second portion 21*b* toward the first portion 21*a*. At this time, for example, the controller 70 sets the first switch SS10 and the first parallel switch SP10 to the nonconducting state DC. The first element SB1 is set to the high resistance state thereby.

In the second detection operation RO2 as shown in FIG. 4, the controller 70 sets the first parallel switch SP10 to the conducting state CN and sets the first switch SS10 to the nonconducting state DC.

Thereby, for example, the potential of the one end CP11 (the second circuit interconnect BLb) of the first parallel capacitance element CP10 changes to a potential corresponding to the electrical resistance of the first element SB1 at this time. When the first element SB1 is in, for example, a high electrical resistance state (e.g., a state in which the magnetization is in an "antiparallel state AP"), the second circuit interconnect BLb has a high voltage HV (e.g., 0.3 V).

For example, the first detection circuit SA1 is configured to output a signal corresponding to the difference between the current flowing in the first interconnect BL1 in the first detection operation RO1 and the current flowing in the first interconnect BL1 in the second detection operation RO2. The signal that is output from the first detection circuit SA1 changes according to the state of the first element SB1. For example, the first detection circuit SA1 is configured to output a signal corresponding to the difference between the potential of the one end CS11 of the first capacitance element CS10 after the first detection operation RO1 and the potential of the one end CP11 of the first parallel capacitance element CP10 after the second detection operation RO2. For example, when the potential of the one end CS11 (the first circuit interconnect BLa) of the first capacitance element CS10 is high and a voltage Vdd is input to a terminal SAE of the first detection circuit SA1, the potential of the second circuit interconnect BLb is clamped to the voltage Vdd; and the potential of the first circuit interconnect BLa is clamped to 0 V.

By performing such a read operation, the memory state of the first element SB1 can be determined based on the electrical resistances (the currents corresponding to the electrical resistances) of the multiple states of the first element SB1. For example, self-referencing reading is performed. The memory state of the first element SB1 can be detected more accurately thereby.

For example, there is a reference example in which the memory state is determined using an established resistance (or an established current) when reading. In such a case, for example, there is a possibility of a misread when the characteristics of the first element SB1 fluctuate due to the fluctuation of the manufacturing processes, etc. Or, an insufficient increase of the storage density may be necessary to suppress the misread.

Conversely, in the embodiment, self-referencing reading such as that recited above is performed. A stable read operation is possible thereby. For example, the storage density can be increased easily. According to the embodiment, a magnetic memory device can be provided in which stable operations are obtained.

After the read operation recited above, the restore operation (the first current supply operation) recited below also may be performed.

As shown in FIG. 5, the controller 70 performs the first current supply operation CO1. The first switch SS10 is set to the conducting state; and the first current i1 is supplied to the conductive member 21 from the first portion 21*a* toward the second portion 21*b*. Because the first switch SS10 is in the conducting state, the first interconnect BL1 has the low voltage LV (e.g., 0 V). For example, the potential of the first portion 21*a* is a slightly high voltage (e.g., 0.8 V); and the voltage of the second portion 21*b* is a slightly low voltage (e.g., 0.6 V). The potential of the first interconnect BL1 (the potential of the first magnetic layer 11) is a potential (the select potential) having the negative polarity. Therefore, the first element SB1 is set to a state (e.g., the low resistance state) corresponding to the orientation of the first current i1 by the first current i1. Thereby, the first element SB1 returns to the state before the read operation. A stable memory state is obtained by such a restore operation.

A case will now be described where the first element SB1 is in the high resistance state before the read operation.

In such a case as well, a first detection operation RO1 similar to that recited above is performed. The first circuit interconnect BLa is set to the high voltage HV (e.g., 0.3 V). Subsequently, the second current supply operation CO2 recited above is performed; and the first element SB1 maintains the high resistance state. Subsequently, a second detection operation RO2 similar to that recited above is performed. The second circuit interconnect BLb has the high voltage HV (e.g., 0.3 V). For example, the output from the first detection circuit SA1 changes according to the difference between the potential of the one end CS11 of the first capacitance element CS10 after the first detection operation RO1 and the potential of the one end CP11 of the first parallel capacitance element CP10 after the second detection operation RO2. When the potential of the one end CS11 of the first capacitance element CS10 is near the potential of the one end CP11 of the first parallel capacitance element CP10 and a high voltage Vdd is input to the terminal SAE of the first detection circuit SA1, the potential of the second circuit interconnect BLb is clamped to 0 V; and the potential of the first circuit interconnect BLa is clamped to the high voltage Vdd. The transistor parameters of the first detection circuit SA1 are set to obtain such an operation. Thereby, it can be discriminated whether the initial data (the state before the read operation) is "0" or "1."

Other than such a method, the initial data also may be discriminated by setting the capacitance of the first capacitance element CS10 and the capacitance of the first parallel capacitance element CP10 to be different from each other.

A stable read operation is possible using self-referencing reading such as that recited above. For example, the storage density can be increased easily. A magnetic memory device can be provided in which stable operations are obtained.

In such a case as well, in the first current supply operation CO1, the controller 70 sets the first switch SS10 to the conducting state and supplies the first current i1 to the conductive member 21. In such a case, the potential of the first interconnect BL1 (the potential of the first magnetic layer 11) is a potential (the unselect potential) having the positive polarity; therefore, the first element SB1 maintains the state after the second current supply operation CO2 even when the first current i1 flows. In other words, the first element SB1 is set to the high resistance state before the read operation. A stable memory state is obtained by such a restore operation. The restore operation recited above can be performed using a simple circuit. For example, a high storage density can be obtained easily.

In the embodiment, the first current supply operation CO1 may be performed as necessary and may not be performed. For example, when the magnetic memory device 110 is used as log memory, the stored information may be lost after reading the information. In such a case, the first current supply operation CO1 may not be performed after the read operation recited above is performed.

As recited above, the potential of the one end CS11 of the first capacitance element CS10 and the potential of the one end CP11 of the first parallel capacitance element CP10 are different from each other when the first element SB1 is in the high resistance state before the read operation. When the first element SB1 is in the low resistance state before the read operation, the potential of the one end CS11 of the first capacitance element CS10 and the potential of the one end CP11 of the first parallel capacitance element CP10 are substantially the same. As recited above, when the capacitance of the first capacitance element CS10 and the capacitance of the first parallel capacitance element CP10 are set to be different, a signal that corresponds to the capacitance difference is obtained; and the initial data can be discriminated based on the signal.

In the embodiment, before the first detection operation RO1, the first element SB1 is in one of a first memory state or a second memory state. The first memory state is one of the high resistance state or the low resistance state. The second memory state is in the other of the high resistance state or the low resistance state. The electrical resistance of the first element SB1 in the high resistance state is higher than the electrical resistance of the first element SB1 in the low resistance state.

In one example, the first element SB1 is in the low resistance state before the first detection operation RO1. After the first current supply operation CO1, the first element SB1 is in the one of the first memory state or the second memory state recited above (the low resistance state). In such a case, after the second current supply operation CO2, the first element SB1 is in the other of the first memory state or the second memory state (the high resistance state).

In another example, the first element SB1 is in the high resistance state before the first detection operation RO1. After the first current supply operation CO1, the first element SB1 is in one of the first memory state or the second memory state (e.g., the high resistance state). In such a case, after the second current supply operation CO2, the first element SB1 is in the one of the first memory state or the second memory state (the high resistance state).

In the second current supply operation CO2, the controller 70 sets the first interconnect BL1 to the first potential while supplying the second current i2 to the conductive member 21. The first potential is one of positive or negative (e.g., negative) when referenced to the potential of the conductive member 21. In one example, the potential of the one end CS11 of the first capacitance element CS10 is the one of positive or negative recited above (e.g., negative) when referenced to the potential of the conductive member 21. The potential of the one end CP11 of the first parallel capacitance element CP10 is the other of positive or negative (e.g., positive) when referenced to the potential of the conductive member 21.

An example of operations of the first circuit 31 illustrated in FIG. 1 to FIG. 5 will now be described.

Figure 6:
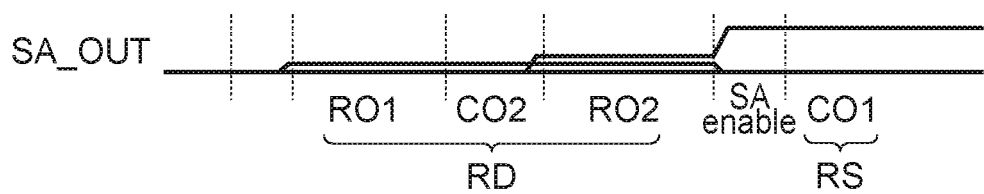
FIG. 6 is a timing chart illustrating operations of the magnetic memory device according to the first embodiment.

FIG. 6 is a timing chart illustrating operations of the magnetic memory device according to the first embodiment.

The horizontal axis of FIG. 6 is time. As shown in FIG. 6, a read operation RD includes the first detection operation RO1, the second current supply operation CO2, and the second detection operation RO2. The second current supply operation CO2 is performed after the first detection operation RO1. The second detection operation RO2 is performed after the second current supply operation CO2 and before the first current supply operation CO1. The first current supply operation CO1 is performed as a restore operation RS after the second detection operation RO2.

In the example, an "SA_enable period" is provided between the second detection operation RO2 and the first current supply operation CO1. For example, the detection result of the first detection circuit SA1 can be output in this period.

In the "SA_enable period" recited above, for example, a signal SA_OUT that corresponds to the difference between the potential of the one end CS11 of the first capacitance element CS10 after the first detection operation RO1 and the potential of the one end CP11 of the first parallel capacitance element CP10 after the second detection operation RO2 is output. Subsequently, the first current supply operation CO1 recited above is performed as necessary.

Second Embodiment

Figure 7:
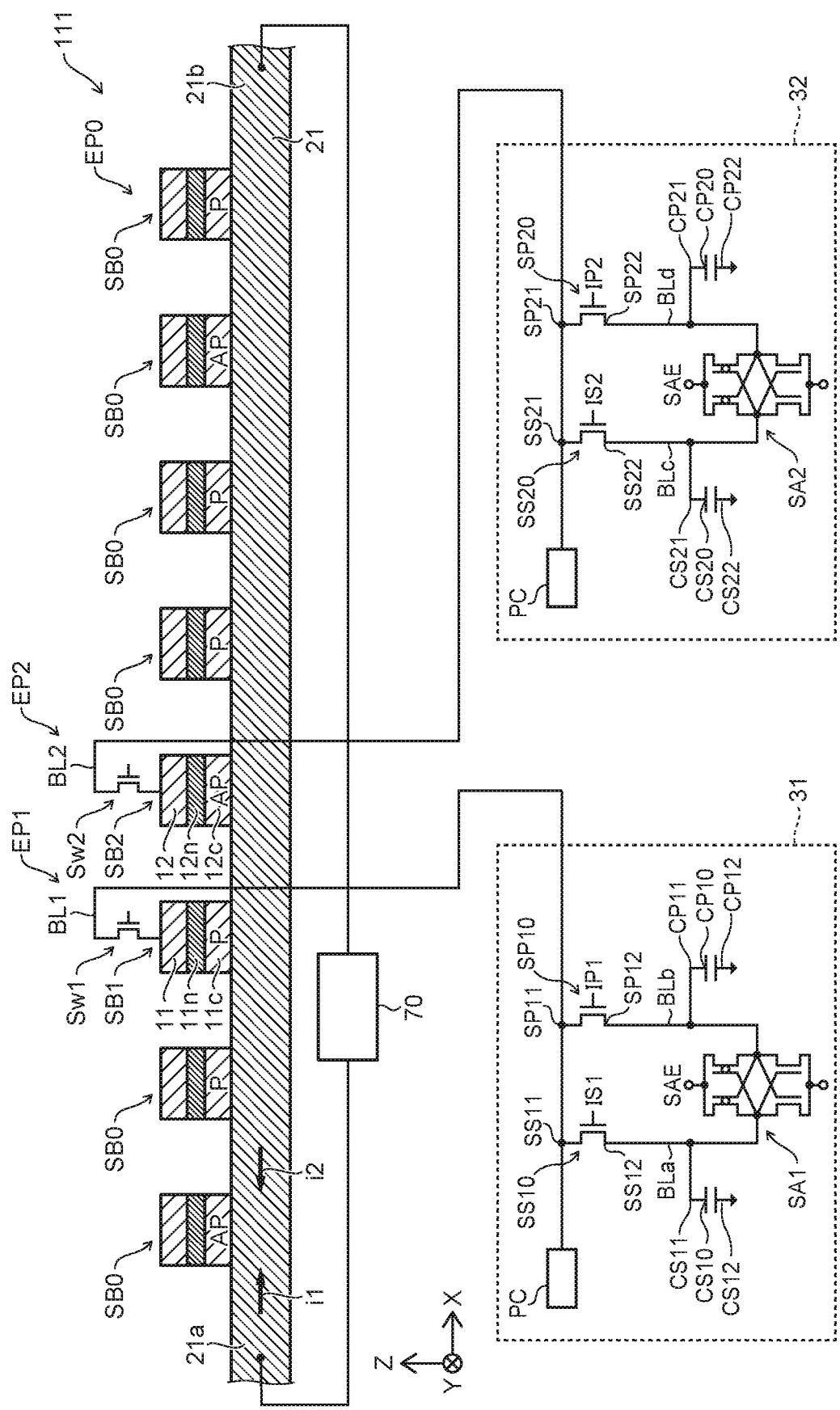
FIG. 7 is a schematic view illustrating a magnetic memory device according to a second embodiment.

FIG. 7 is a schematic view illustrating a magnetic memory device according to a second embodiment.

As shown in FIG. 7, the magnetic memory device 111 according to the embodiment further includes a second element portion EP2 in addition to the conductive member 21, the first element portion EP1, and the controller 70. The second element portion EP2 includes a second element SB2, a second interconnect BL2, and a second circuit 32.

The second element SB2 includes a second magnetic layer 12, a second counter magnetic layer 12c, and a second nonmagnetic layer 12n. The second counter magnetic layer 12c is provided between the second magnetic layer 12 and another portion of the third portion 21c. The second nonmagnetic layer 12n is provided between the second counter magnetic layer 12c and the second magnetic layer 12.

The second interconnect BL2 is electrically connected to the second magnetic layer 12. The second circuit 32 is electrically connected to the second interconnect BL2.

The second circuit 32 includes, for example, a second switch SS20, a second capacitance element CS20, a second parallel switch SP20, and a second parallel capacitance element CP20.

One end SS21 of the second switch SS20 is electrically connected to the second interconnect BL2.

Another end SS22 of the second switch SS20 is electrically connected to one end CS21 of the second capacitance element CS20.

One end SP21 of the second parallel switch SP20 is electrically connected to the second interconnect BL2.

Another end SP22 of the second parallel switch SP20 is electrically connected to one end CP21 of the second parallel capacitance element CP20.

Another end CP22 of the second parallel capacitance element CP20 is electrically connected to another end CS22 of the second capacitance element CS20. In the example, the other end CP22 is electrically connected to the other end CS22 via ground.

For example, a second switch signal IS2 is input to the gate of the second switch SS20. A second parallel switch signal IP2 is input to the gate of the second parallel switch SP20.

The second circuit 32 includes a second detection circuit SA2. The second detection circuit SA2 is electrically connected to the one end CS21 of the second capacitance element CS20 and the one end CP21 of the second parallel capacitance element CP20.

In the example as well, the pre-charge circuit PC is electrically connected to the second interconnect BL2. The potential of the second interconnect BL2 can be controlled by the pre-charge circuit PC supplying a charge to the second interconnect BL2.

In the magnetic memory device 111 as well, the first detection operation RO1, the second current supply operation CO2, the second detection operation RO2, the first current supply operation CO1, etc., recited above are performed for the first element portion EP1. In the magnetic memory device 111, the first detection operation RO1, the second current supply operation CO2, the second detection operation RO2, the first current supply operation CO1, etc., recited above may be performed for the second element portion EP2.

FIG. 8A to FIG. 8C and FIG. 9 are schematic views illustrating operations of the magnetic memory device according to the second embodiment.

For example, for the second element SB2, the controller 70 performs a first detection operation, a current supply operation after the first detection operation RO1, and a second detection operation after the current supply operation. For example, these operations for the second element SB2 are similar to the operations for the first element SB1.

In the first detection operation RO1 (referring to FIG. 8A), the controller 70 sets the second switch SS20 to the conducting state CN and sets the second parallel switch SP20 to the nonconducting state DC (referring to FIG. 7).

In the current supply operation (the second current supply operation CO2; referring to FIG. 8B), the controller 70 supplies a current (the second current i2) to the conductive member 21 from the second portion 21b toward the first portion 21a.

In the second detection operation RO2 (referring to FIG. 8C), the controller 70 sets the second parallel switch SP20 to the conducting state CN and sets the second switch SS20 to the nonconducting state DC (referring to FIG. 7).

The second detection circuit SA2 (referring to FIG. 7) is configured to output a signal corresponding to the difference between the potential of the one end CS21 of the second capacitance element CS20 after the first detection operation RO1 and the potential of the one end CP21 of the second parallel capacitance element CP20 after the second detection operation RO2.

Thus, for example, self-referencing reading is performed for the second element SB2. A stable read operation is possible. For example, the storage density can be increased easily.

The second current supply operation CO2 recited above may be performed simultaneously for the first element SB1 and the second element SB2. The time of the second current supply operation CO2 can be shortened thereby.

Figure 9:
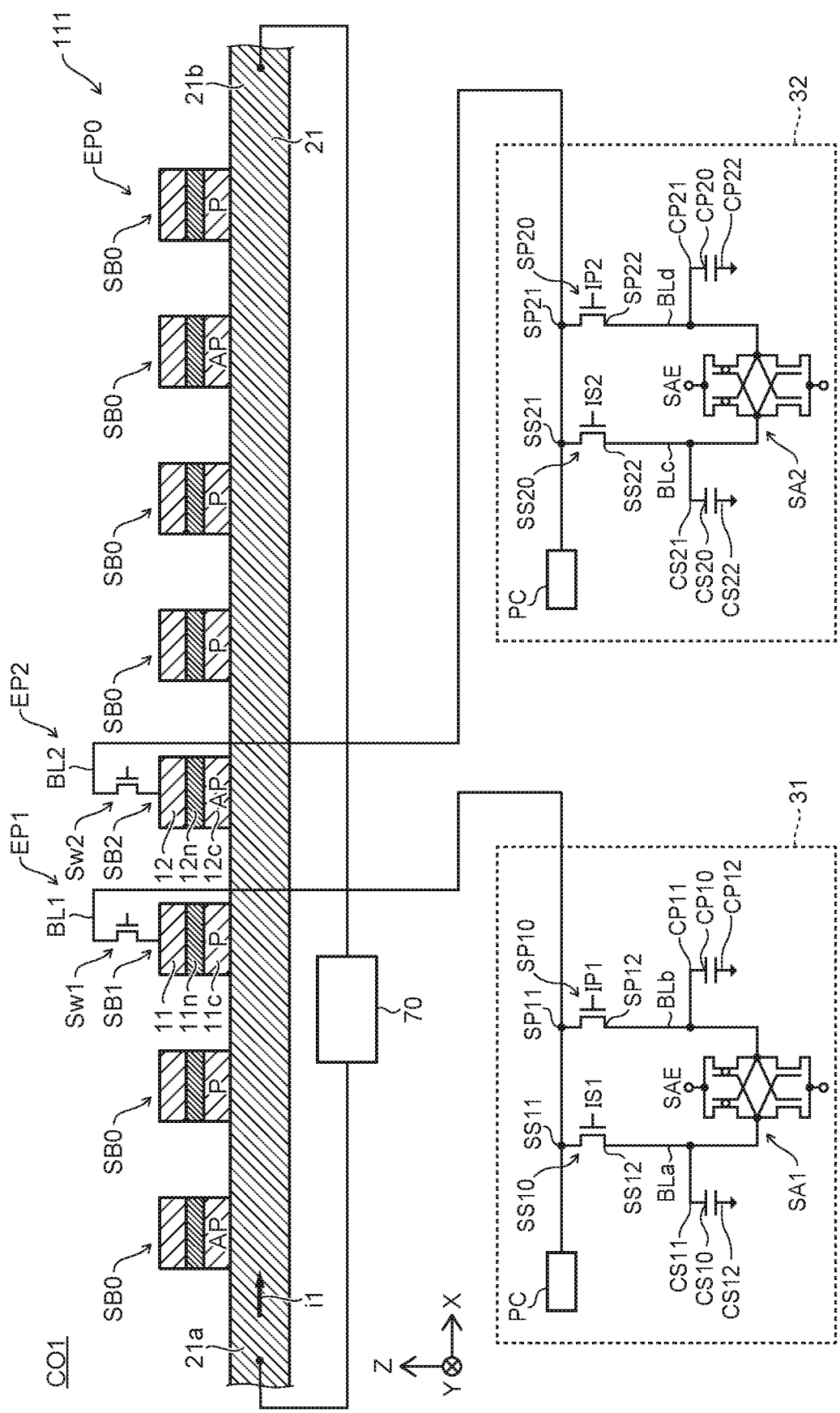
FIG. 9 is a schematic view illustrating the operation of the magnetic memory device according to the second embodiment.

The controller 70 may perform at least another first current supply operation CO1 (referring to FIG. 9). In the other first current supply operation CO1, the controller 70 sets the second switch SS20 to the conducting state CN and supplies the first current i1 to the conductive member 21. Thereby, the second element SB2 returns to the state of the second element SB2 before the read operation RD (before the first detection operation RO1). A stable memory state is obtained by such a restore operation.

For example, the first current supply operation CO1 may be performed collectively for the first element portion EP1 and the second element portion EP2.

The first current supply operation CO1 may be performed as necessary for the second element SB2 and may be omitted.

Such operations may be performed for multiple memory cells.

For example, as shown in FIG. 7, the magnetic memory device 111 according to the embodiment may include the conductive member 21, multiple element portions EP0, and the controller 70. The multiple element portions EP0 include the first element portion EP1, the second element portion EP2, etc.

One of the multiple element portions EP0 (e.g., the first element portion EP1) includes the first element SB1, the first interconnect BL1, and the first circuit 31. Another one of the multiple element portions EP0 (e.g., the second element portion EP2) includes the second element SB2, the second interconnect BL2, and the second circuit 32. The first elements SB1 of the multiple element portions EP0 are arranged along the direction (e.g., the X-axis direction) from the first portion 21a toward the second portion 21b.

The controller 70 performs the read operation RD that includes the first detection operation RO1, a current supply operation (e.g., the second current supply operation CO2), and the second detection operation RO2 for at least two of the multiple element portions EP0. For example, the current supply operation (e.g., the second current supply operation CO2) may be performed collectively for the multiple element portions EP0.

The controller 70 may perform the first current supply operation CO1 for at least two of the multiple element portions EP0. In the first current supply operation CO1, the controller 70 sets the first switch SS10 to the conducting state and supplies the first current i1 to the conductive member 21. The first current supply operation CO1 may be performed collectively for the multiple element portions EP0.

Before the read operation RD as shown in FIG. 7, the first element SB1 is in the "parallel state P," e.g., the low resistance state; and the second element SB2 is in the "antiparallel state AP," e.g., the high resistance state. Multiple elements SB0 are in the "parallel state P" or the "antiparallel state AP." In the second current supply operation CO2 as shown in FIG. 8B, for example, the multiple elements SB0 are in the "antiparallel state AP." In the first current supply operation CO1 as shown in FIG. 9, the multiple elements SB0 have returned to the original state (the state of FIG. 7).

In at least one of the first detection operation RO1 or the second detection operation RO2 in the embodiment, a current that has the orientation from the third portion 21c toward the first portion 21a and a current that has the orientation from the third portion 21c toward the second portion 21b may flow through the conductive member 21. In such a case, for example, a current that has the orientation from the first element SB1 toward the first portion 21a and a current that has the orientation from the first element SB1 toward the second portion 21b flow. The potential of the first magnetic layer 11 is higher than the potential of the conductive member 21. The first magnetic layer 11 is, for example, the "unselect potential." The change of the electrical resistance due to the current in the detection operation is suppressed thereby.

In at least one of the first detection operation RO1 or the second detection operation RO2 in the embodiment, a current that has the orientation from the first portion 21a toward the third portion 21c and a current that has the orientation from the second portion 21b toward the third portion 21c may flow through the conductive member 21. In such a case, the spin Hall effect due to the current is small in the third portion 21c; and the change of the electrical resistance due to the current in the detection operation is suppressed.

In at least one of the first detection operation RO1 or the second detection operation RO2 in the embodiment, a current may flow from the first portion 21a toward the third portion 21c and from the third portion 21c toward the second portion 21b. For example, the spin Hall effect and the spin-transfer effect are weak. The change of the electrical resistance due to the current in the detection operation is suppressed.

In at least one of the first detection operation RO1 or the second detection operation RO2 in the embodiment, a current may flow from the second portion 21b toward the third portion 21c and from the third portion 21c toward the first portion 21a. For example, the spin Hall effect and the spin-transfer effect are weak. The change of the electrical resistance due to the current in the detection operation is suppressed.

In the magnetic memory device in the embodiment, the first element portion EP1 includes the first element SB1. The controller 70 performs at least the first detection operation RO1, a current supply operation (the second current supply operation CO2) after the first detection operation RO1, and the second detection operation RO2 after the current supply operation. In the current supply operation, the controller 70 supplies a current to the conductive member 21 from the second portion 21b toward the first portion 21a of the conductive member 21. The controller 70 is configured to output a signal corresponding to the difference between the current flowing through the first element portion EP1 in the first detection operation RO1 and the current flowing through the first element portion EP1 in the second detection operation RO2.

The controller 70 may further perform another current supply operation (the first current supply operation CO1) after the second detection operation RO2. For example, the controller 70 is configured to store a value for the current flowing through the first element portion EP1 in the first detection operation RO1 and a value for the current flowing through the first element portion EP1 in the second detection operation RO2. In the other current supply operation (the first current supply operation CO1), the controller 70 applies a voltage to the first element SB1 while supplying a current to the conductive member 21 from the first portion 21a toward the second portion 21b. The voltage is based on at least one of the value stored for the current flowing through the first element portion EP1 in the first detection operation RO1 or the value stored for the current flowing through the first element portion EP1 in the second detection operation RO2.

Before the first detection operation RO1, the first element SB1 is in one of the first memory state or the second memory state. After the other current supply operation recited above (the first current supply operation CO1), the first element SB1 is in the one of the first memory state or the second memory state recited above. In one example, after the current supply operation recited above (the second current supply operation CO2), the first element SB1 is in the other of the first memory state or the second memory state. In another example, after the current supply operation recited above (the second current supply operation CO2), the first element SB1 is in the one of the first memory state or the second memory state recited above.

In the embodiment, the conductive member 21 includes, for example, at least one selected from the group consisting of Ta, W, Pt, and Au.

The first magnetic layer 11 and the first counter magnetic layer 11c are, for example, ferromagnetic layers. The first magnetic layer 11 and the first counter magnetic layer 11c include, for example, at least one selected from the group consisting of Fe, Co, and Ni.

The first nonmagnetic layer 11n includes, for example, a first element and a second element. The first element includes, for example, at least one selected from the group consisting of Mg, Ca, Sr, Ti, V, Nb, Al, Si, Cr, Zn, Ga, Ge, Se, Zr, Nb, Mo, Ru, Rh, Pd, Cd, In, Sn, Sb, Hf, Ta, W, Ir, Bi, Cs, St, La, and Ce. The second element includes at least one selected from the group consisting of oxygen and nitrogen. The first nonmagnetic layer 11n includes, for example, MgO. The first nonmagnetic layer 11n is, for example, a tunnel barrier layer.

In one example, the first nonmagnetic layer 11n and the first counter magnetic layer 11c contact each other. Another layer may be provided between the first nonmagnetic layer 11n and the first counter magnetic layer 11c. In one example, the first magnetic layer 11 and the first nonmagnetic layer 11n contact each other. Another layer may be provided between the first magnetic layer 11 and the first nonmagnetic layer 11n.

In one example, the conductive member 21 and the first counter magnetic layer 11c contact each other. Another layer may be provided between the conductive member 21 and the first counter magnetic layer 11c.

For example, the second magnetic layer 12, the second counter magnetic layer 12c, and the second nonmagnetic layer 12n respectively have the configurations of the first magnetic layer 11, the first counter magnetic layer 11c, and the first nonmagnetic layer 11n.

The embodiments include, for example, the following configurations (e.g., technological proposals).

Configuration 1

A magnetic memory device, comprising:

a conductive member including a first portion, a second portion, and a third portion between the first portion and the second portion;

a first element portion, the first element portion including a first element, a first interconnect, and a first circuit, the first element including a first magnetic layer, a first counter magnetic layer, and a first nonmagnetic layer, the first counter magnetic layer being provided between the third portion and the first magnetic layer, the first nonmagnetic layer being provided between the first counter magnetic layer and the first magnetic layer, the first interconnect being electrically connected to the first magnetic layer, the first circuit being electrically connected to the first interconnect; and a controller, the first circuit including a first switch, a first capacitance element, a first parallel switch, and a first parallel capacitance element, one end of the first switch being electrically connected to the first interconnect, an other end of the first switch being electrically connected to one end of the first capacitance element, one end of the first parallel switch being electrically connected to the first interconnect, an other end of the first parallel switch being electrically connected to one end of the first parallel capacitance element, the controller performing at least a first current supply operation, in the first current supply operation, the controller setting the first switch to a conducting state and supplying a first current to the conductive member from the first portion toward the second portion.

Configuration 2

The magnetic memory device according to Configuration 1, wherein the first circuit further includes a first detection circuit electrically connected to the one end of the first capacitance element and the one end of the first parallel capacitance element, the controller further performs at least a first detection operation, a second current supply operation after the first detection operation, and a second detection operation after the second current supply operation and before the first current supply operation, in the first detection operation, the controller sets the first switch to the conducting state and sets the first parallel switch to a nonconducting state, in the second current supply operation, the controller supplies a second current to the conductive member from the second portion toward the first portion, in the second detection operation, the controller sets the first parallel switch to the conducting state and sets the first switch to the nonconducting state, and the first detection circuit is configured to output a signal corresponding to a difference between a potential of the one end of the first capacitance element after the first detection operation and a potential of the one end of the first parallel capacitance element after the second detection operation.

Configuration 3

The magnetic memory device according to Configuration 2, wherein before the first detection operation, the first element is in one of a first memory state or a second memory state, and after the first current supply operation, the first element is in the one of the first memory state or the second memory state.

Configuration 4

The magnetic memory device according to Configuration 3, wherein after the second current supply operation, the first element is in the other of the first memory state or the second memory state.

Configuration 5

The magnetic memory device according to Configuration 3, wherein after the second current supply operation, the first element is in the one of the first memory state or the second memory state.

Configuration 6

The magnetic memory device according to any one of Configurations 2 to 5, wherein in the second current supply operation, the controller sets the first interconnect to a first potential while supplying the second current to the conductive member, the first potential is one of positive or negative when referenced to a potential of the conductive member, the potential of the one end of the first capacitance element is the one of positive or negative when referenced to the potential of the conductive member, and the potential of the one end of the first parallel capacitance element is the other of positive or negative when referenced to the potential of the conductive member.

Configuration 7

The magnetic memory device according to any one of Configurations 1 to 6, further comprising a second element portion, the second element portion including a second element, a second interconnect, and a second circuit, the second element including a second magnetic layer, a second counter magnetic layer, and a second nonmagnetic layer, the second counter magnetic layer being provided between the second magnetic layer and an other portion of the third portion, the second nonmagnetic layer being provided between the second counter magnetic layer and the second magnetic layer, the second interconnect being electrically connected to the second magnetic layer, the second circuit being electrically connected to the second interconnect, the second circuit including a second switch, a second capacitance element, a second parallel switch, and a second parallel capacitance element, one end of the second switch being electrically connected to the second interconnect, an other end of the second switch being electrically connected to one end of the second capacitance element, one end of the second parallel switch being electrically connected to the second interconnect, an other end of the second parallel switch being electrically connected to one end of the second parallel capacitance element, the controller performing at least an other first current supply operation, in the other first current supply operation, the controller setting the second switch to a conducting state and supplying the first current to the conductive member.

Configuration 8

A magnetic memory device, comprising:

a conductive member including a first portion, a second portion, and a third portion between the first portion and the second portion, a first element portion, the first element portion including a first element, a first interconnect, and a first circuit, the first element including a first magnetic layer, a first counter magnetic layer, and a first nonmagnetic layer, the first counter magnetic layer being provided between the third portion and the first magnetic layer, the first nonmagnetic layer being provided between the first counter magnetic layer and the first magnetic layer, the first interconnect being electrically connected to the first magnetic layer, the first circuit being electrically connected to the first interconnect; and a controller, the first circuit including a first switch, a first capacitance element, a first parallel switch, a first parallel capacitance element, and a first detection circuit, one end of the first switch being electrically connected to the first interconnect, an other end of the first switch being electrically connected to one end of the first capacitance element, one end of the first parallel switch being electrically connected to the first interconnect, an other end of the first parallel switch being electrically connected to one end of the first parallel capacitance element, the first detection circuit being electrically connected to the one end of the first capacitance element and the one end of the first parallel capacitance element, the controller performing at least a first detection operation, a current supply operation after the first detection operation, and a second detection operation after the current supply operation, in the first detection operation, the controller setting the first switch to the conducting state and setting the first parallel switch to a nonconducting state, in the current supply operation, the controller supplying a current to the conductive member from the second portion toward the first portion, in the second detection operation, the controller setting the first parallel switch to the conducting state and setting the first switch to the nonconducting state, the first detection circuit being configured to output a signal corresponding to a difference between a potential of the one end of the first capacitance element after the first detection operation and a potential of the one end of the first parallel capacitance element after the second detection operation.

Configuration 9

The magnetic memory device according to Configuration 8, wherein before the first detection operation, the first element is in one of a first memory state or a second memory state, after the current supply operation, the first element is in the one of the first memory state or the second memory state.

Configuration 10

The magnetic memory device according to Configuration 9, wherein after the current supply operation, the first element is in the other of the first memory state or the second memory state.

Configuration 11

The magnetic memory device according to Configuration 9, wherein after the current supply operation, the first element is in the one of the first memory state or the second memory state.

Configuration 12

The magnetic memory device according to any one of Configurations 9 to 11, wherein in the current supply operation, the controller sets the first interconnect to a first potential while supplying the current to the conductive member, the first potential is one of positive or negative when referenced to a potential of the conductive member, after the second detection operation, the potential of the one end of the first capacitance element is the one of positive or negative when referenced to the potential of the conductive member, and after the second detection operation, the potential of the one end of the first parallel capacitance element is the other of positive or negative when referenced to the potential of the conductive member.

Configuration 13

A magnetic memory device, comprising:

a conductive member including a first portion, a second portion, and a third portion between the first portion and the second portion;

a plurality of element portions; and a controller, one of the plurality of element portions including a first element, a first interconnect, and a first circuit, the first element including a first magnetic layer, a first counter magnetic layer provided between the third portion and the first magnetic layer, and a first nonmagnetic layer provided between the first counter magnetic layer and the first magnetic layer, the first elements of the plurality of element portions being arranged along a direction from the first portion toward the second portion, the first interconnect being electrically connected to the first magnetic layer, the first circuit being electrically connected to the first interconnect, the first circuit including a first switch, a first capacitance element, a first parallel switch, and a first parallel capacitance element, one end of the first switch being electrically connected to the first interconnect, an other end of the first switch being electrically connected to one end of the first capacitance element, one end of the first parallel switch being electrically connected to the first interconnect, an other end of the first parallel switch being electrically connected to one end of the first parallel capacitance element, the controller performing at least a first current supply operation, in the first current supply operation, the controller setting the first switch to a conducting state and supplying a first current to the conductive member from the first portion toward the second portion.

Configuration 14

The magnetic memory device according to Configuration 13, wherein the first circuit further includes a first detection circuit electrically connected to the one end of the first capacitance element and the one end of the first parallel capacitance element, the controller further performs at least a first detection operation, a second current supply operation after the first detection operation, and a second detection operation after the second current supply operation and before the first current supply operation, in the first detection operation, the controller sets the first switch to the conducting state and sets the first parallel switch to a nonconducting state, in the second current supply operation, the controller supplies a second current to the conductive member from the second portion toward the first portion, in the second detection operation, the controller sets the first parallel switch to the conducting state and sets the first switch to the nonconducting state, and the first detection circuit is configured to output a signal corresponding to a difference between a potential of the one end of the first capacitance element after the first detection operation and a potential of the one end of the first parallel capacitance element after the second detection operation.

Configuration 15

The magnetic memory device according to Configuration 14, wherein the controller performs the second current supply operation for two or more of the first elements of the plurality of element portions.

Configuration 16

A magnetic memory device, comprising:

a conductive member including a first portion, a second portion, and a third portion between the first portion and the second portion;

a plurality of element portions; and a controller, one of the plurality of element portions including a first element, a first interconnect, and a first circuit, the first element including a first magnetic layer, a first counter magnetic layer provided between the third portion and the first magnetic layer, and a first nonmagnetic layer provided between the first counter magnetic layer and the first magnetic layer, the first elements of the plurality of element portions being arranged along a direction from the first portion toward the second portion, the first interconnect being electrically connected to the first magnetic layer, the first circuit being electrically connected to the first interconnect, the first circuit including a first switch, a first capacitance element, a first parallel switch, a first parallel capacitance element, and a first detection circuit, one end of the first switch being electrically connected to the first interconnect, an other end of the first switch being electrically connected to one end of the first capacitance element, one end of the first parallel switch being electrically connected to the first interconnect, an other end of the first parallel switch being electrically connected to one end of the first parallel capacitance element, the first detection circuit being electrically connected to the one end of the first capacitance element and the one end of the first parallel capacitance element, the controller performing at least a first detection operation, a current supply operation after the first detection operation, and a second detection operation after the current supply operation, in the first detection operation, the controller setting the first switch to the conducting state and setting the first parallel switch to a nonconducting state, in the current supply operation, the controller supplying a current to the conductive member from the second portion toward the first portion, in the second detection operation, the controller setting the first parallel switch to the conducting state and setting the first switch to the nonconducting state, the first detection circuit being configured to output a signal corresponding to a difference between a potential of the one end of the first capacitance element after the first detection operation and a potential of the one end of the first parallel capacitance element after the second detection operation.

Configuration 17

The magnetic memory device according to Configuration 16, wherein before the first detection operation, the first element is in one of a first memory state or a second memory state, and after the current supply operation, the first element is in the one of the first memory state or the second memory state.

Configuration 18

The magnetic memory device according to Configuration 16, wherein after the current supply operation, the first element is in the other of the first memory state or the second memory state.

Configuration 19

The magnetic memory device according to Configuration 16, wherein after the current supply operation, the first element is in the one of the first memory state or the second memory state.

Configuration 20

The magnetic memory device according to any one of Configurations 16 to 19, wherein in the current supply operation, the controller sets the first interconnect to a first potential while supplying the current to the conductive member, the first potential is one of positive or negative when referenced to a potential of the conductive member, after the second detection operation, the potential of the one end of the first capacitance element is the one of positive or negative when referenced to the potential of the conductive member, and after the second detection operation, the potential of the one end of the first parallel capacitance element is the other of positive or negative when referenced to the potential of the conductive member.

Configuration 21

The magnetic memory device according to any one of Configurations 2 to 6, 8 to 12, 14, 15, and 16 to 20, wherein in at least one of the first detection operation or the second detection operation, a current having an orientation from the third portion toward the first portion and a current having an orientation from the third portion toward the second portion flow through the conductive member.

Configuration 22

The magnetic memory device according to any one of Configurations 2 to 6, 8 to 12, 14, 15, and 16 to 20, wherein in at least one of the first detection operation or the second detection operation, a current having an orientation from the first portion toward the third portion and a current having an orientation from the second portion toward the third portion flow through the conductive member.

Configuration 23

The magnetic memory device according to any one of Configurations 2 to 6, 8 to 12, 14, 15, and 16 to 20, wherein in at least one of the first detection operation or the second detection operation, a current flows from the first portion toward the third portion and from the third portion toward the second portion.

Configuration 24

The magnetic memory device according to any one of Configurations 2 to 6, 8 to 12, 14, 15, and 16 to 20, wherein in at least one of the first detection operation or the second detection operation, a current flows from the second portion toward the third portion and from the third portion toward the first portion.

Configuration 25

A magnetic memory device, comprising:

a conductive member including a first portion, a second portion, and a third portion between the first portion and the second portion;

a first element portion, the first element portion including a first element and a first interconnect, the first element including a first magnetic layer, a first counter magnetic layer, and a first nonmagnetic layer, the first counter magnetic layer being provided between the third portion and the first magnetic layer, the first nonmagnetic layer being provided between the first counter magnetic layer and the first magnetic layer; and a controller, the controller performing at least a first detection operation, a current supply operation after the first detection operation, and a second detection operation after the current supply operation, in the current supply operation, the controller supplying a current to the conductive member from the second portion toward the first portion, the controller being configured to output a signal corresponding to a difference between a current flowing through the first element portion in the first detection operation and a current flowing through the first element portion in the second detection operation.

Configuration 26

The magnetic memory device according to Configuration 25, wherein the controller is configured to further perform an other current supply operation after the second detection operation, the controller is configured to store a value for the current flowing through the first element portion in the first detection operation and a value for the current flowing through the first element portion in the second detection operation, in the other current supply operation, while supplying a current to the conductive member from the first portion toward the second portion, the controller applies a voltage to the first element based on at least one of the value stored for the current flowing through the first element portion in the first detection operation or the value stored for the current flowing through the first element portion in the second detection operation.

Configuration 27

The magnetic memory device according to Configuration 25, wherein before the first detection operation, the first element is in one of a first memory state or a second memory state, and after the other current supply operation, the first element is in the one of the first memory state or the second memory state.

Configuration 28

The magnetic memory device according to Configuration 27, wherein after the current supply operation, the first element is in the other of the first memory state or the second memory state.

Configuration 29

The magnetic memory device according to Configuration 27, wherein after the current supply operation, the first element is in the one of the first memory state or the second memory state.

According to the embodiments, a magnetic memory device can be provided in which more stable operations are obtained.

In this specification, the "state of being electrically connected" includes the state in which multiple conductive bodies are physically in contact, and a current flows between the multiple conductive bodies. The "state of being electrically connected" includes the state in which another conductive body is inserted between multiple conductive bodies, and a current flows between the multiple conductive bodies. The "state of being electrically connected" includes the state in which an electrical element (a switch such as a transistor or the like) is inserted between multiple conductive bodies so that a state is formable in which a current flows between the multiple conductive bodies.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in magnetic memory devices such as conductive members, magnetic layers, nonmagnetic layers, circuits, controllers, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all magnetic memory devices practicable by an appropriate design modification by one skilled in the art based on the magnetic memory devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A magnetic memory device, comprising:

a conductive member including a first portion, a second portion, and a third portion between the first portion and the second portion;

a first element portion, the first element portion including a first element, a first interconnect, and a first circuit, the first element including a first magnetic layer, a first counter magnetic layer, and a first nonmagnetic layer, the first counter magnetic layer being provided between the third portion and the first magnetic layer, the first nonmagnetic layer being provided between the first counter magnetic layer and the first magnetic layer, the first interconnect being electrically connected to the first magnetic layer, the first circuit being electrically connected to the first interconnect; and a controller, the first circuit including a first switch, a first capacitance element, a first parallel switch, and a first parallel capacitance element, one end of the first switch being electrically connected to the first interconnect, an other end of the first switch being electrically connected to one end of the first capacitance element, one end of the first parallel switch being electrically connected to the first interconnect, an other end of the first parallel switch being electrically connected to one end of the first parallel capacitance element, the controller performing at least a first current supply operation, in the first current supply operation, the controller setting the first switch to a conducting state and supplying a first current to the conductive member from the first portion toward the second portion.

2. The device according to claim 1, wherein
the first circuit further includes a first detection circuit electrically connected to the one end of the first capacitance element and the one end of the first parallel capacitance element, the controller further performs at least a first detection operation, a second current supply operation after the first detection operation, and a second detection operation after the second current supply operation and before the first current supply operation, in the first detection operation, the controller sets the first switch to the conducting state and sets the first parallel switch to a nonconducting state, in the second current supply operation, the controller supplies a second current to the conductive member from the second portion toward the first portion, in the second detection operation, the controller sets the first parallel switch to the conducting state and sets the first switch to the nonconducting state, and the first detection circuit is configured to output a signal corresponding to a difference between a potential of the one end of the first capacitance element after the first detection operation and a potential of the one end of the first parallel capacitance element after the second detection operation.

3. The device according to claim 2, wherein
before the first detection operation, the first element is in one of a first memory state or a second memory state, and after the first current supply operation, the first element is in the one of the first memory state or the second memory state.

4. The device according to claim 3, wherein after the second current supply operation, the first element is in the other of the first memory state or the second memory state.

5. The device according to claim 3, wherein after the second current supply operation, the first element is in the one of the first memory state or the second memory state.

6. The device according to claim 2, wherein
in the second current supply operation, the controller sets the first interconnect to a first potential while supplying the second current to the conductive member, the first potential is one of positive or negative when referenced to a potential of the conductive member, the potential of the one end of the first capacitance element is the one of positive or negative when referenced to the potential of the conductive member, and the potential of the one end of the first parallel capacitance element is the other of positive or negative when referenced to the potential of the conductive member.

7. The device according to claim 1, further comprising a second element portion,
the second element portion including a second element, a second interconnect, and a second circuit, the second element including a second magnetic layer, a second counter magnetic layer, and a second nonmagnetic layer, the second counter magnetic layer being provided between the second magnetic layer and an other portion of the third portion, the second nonmagnetic layer being provided between the second counter magnetic layer and the second magnetic layer, the second interconnect being electrically connected to the second magnetic layer, the second circuit being electrically connected to the second interconnect, the second circuit including a second switch, a second capacitance element, a second parallel switch, and a second parallel capacitance element, one end of the second switch being electrically connected to the second interconnect, an other end of the second switch being electrically connected to one end of the second capacitance element, one end of the second parallel switch being electrically connected to the second interconnect, an other end of the second parallel switch being electrically connected to one end of the second parallel capacitance element, the controller performing at least an other first current supply operation, in the other first current supply operation, the controller setting the second switch to a conducting state and supplying the first current to the conductive member.

8. A magnetic memory device, comprising:
a conductive member including a first portion, a second portion, and a third portion between the first portion and the second portion;

a plurality of element portions; and a controller, one of the plurality of element portions including a first element, a first interconnect, and a first circuit, the first element including
a first magnetic layer,
a first counter magnetic layer provided between the third portion and the first magnetic layer, and
a first nonmagnetic layer provided between the first counter magnetic layer and the first magnetic layer, the first elements of the plurality of element portions being arranged along a direction from the first portion toward the second portion, the first interconnect being electrically connected to the first magnetic layer, the first circuit being electrically connected to the first
  interconnect,
the first circuit including a first switch, a first capacitance
  element, a first parallel switch, and a first parallel
  capacitance element,
one end of the first switch being electrically connected to
  the first interconnect,
an other end of the first switch being electrically connected to one end of the first capacitance element,
one end of the first parallel switch being electrically
  connected to the first interconnect,
an other end of the first parallel switch being electrically
  connected to one end of the first parallel capacitance
  element,
the controller performing at least a first current supply
  operation,
in the first current supply operation, the controller setting
  the first switch to a conducting state and supplying a
  first current to the conductive member from the first
  portion toward the second portion.

9. The device according to claim 8, wherein
the first circuit further includes a first detection circuit
  electrically connected to the one end of the first capacitance element and the one end of the first parallel
  capacitance element,
the controller further performs at least a first detection
  operation, a second current supply operation after the
  first detection operation, and a second detection operation after the second current supply operation and
  before the first current supply operation,
in the first detection operation, the controller sets the first
  switch to the conducting state and sets the first parallel
  switch to a nonconducting state,
in the second current supply operation, the controller
  supplies a second current to the conductive member
  from the second portion toward the first portion,
in the second detection operation, the controller sets the
  first parallel switch to the conducting state and sets the
  first switch to the nonconducting state, and
the first detection circuit is configured to output a signal
  corresponding to a difference between a potential of the
  one end of the first capacitance element after the first
  detection operation and a potential of the one end of the
  first parallel capacitance element after the second
  detection operation.

10. The device according to claim 9, wherein the controller performs the second current supply operation for two or more of the first elements of the plurality of element portions.

11. A magnetic memory device, comprising:
a conductive member including a first portion, a second
  portion, and a third portion between the first portion
  and the second portion;
a plurality of element portions; and
a controller,
one of the plurality of element portions including a first
  element, a first interconnect, and a first circuit,
the first element including
  a first magnetic layer,
  a first counter magnetic layer provided between the
    third portion and the first magnetic layer, and
  a first nonmagnetic layer provided between the first
    counter magnetic layer and the first magnetic layer,
the first elements of the plurality of element portions
  being arranged along a direction from the first portion
  toward the second portion,
the first interconnect being electrically connected to the
  first magnetic layer,
the first circuit being electrically connected to the first
  interconnect,
the first circuit including a first switch, a first capacitance
  element, a first parallel switch, a first parallel capacitance element, and a first detection circuit,
one end of the first switch being electrically connected to
  the first interconnect,
an other end of the first switch being electrically connected to one end of the first capacitance element,
one end of the first parallel switch being electrically
  connected to the first interconnect,
an other end of the first parallel switch being electrically
  connected to one end of the first parallel capacitance
  element,
the first detection circuit being electrically connected to
  the one end of the first capacitance element and the one
  end of the first parallel capacitance element,
the controller performing at least a first detection operation, a current supply operation after the first detection
  operation, and a second detection operation after the
  current supply operation,
in the first detection operation, the controller setting the
  first switch to the conducting state and setting the first
  parallel switch to a nonconducting state,
in the current supply operation, the controller supplying a
  current to the conductive member from the second
  portion toward the first portion,
in the second detection operation, the controller setting
  the first parallel switch to the conducting state and
  setting the first switch to the nonconducting state,
the first detection circuit being configured to output a
  signal corresponding to a difference between a potential
  of the one end of the first capacitance element after the
  first detection operation and a potential of the one end
  of the first parallel capacitance element after the second
  detection operation.

12. The device according to claim 11, wherein
before the first detection operation, the first element is in
  one of a first memory state or a second memory state,
after the current supply operation, the first element is in
  the one of the first memory state or the second memory
  state.

13. The device according to claim 11, wherein after the current supply operation, the first element is in the other of the first memory state or the second memory state.

14. The device according to claim 11, wherein after the current supply operation, the first element is in the one of the first memory state or the second memory state.

15. The device according to claim 11, wherein
in the current supply operation, the controller sets the first
  interconnect to a first potential while supplying the
  current to the conductive member,
the first potential is one of positive or negative when
  referenced to a potential of the conductive member,
after the second detection operation, the potential of the
  one end of the first capacitance element is the one of
  positive or negative when referenced to the potential of
  the conductive member, and
after the second detection operation, the potential of the
  one end of the first parallel capacitance element is the
  other of positive or negative when referenced to the
  potential of the conductive member.

* * * * *